(12) United States Patent
Choi et al.

(10) Patent No.: US 7,774,678 B2
(45) Date of Patent: Aug. 10, 2010

(54) APPARATUS AND METHOD FOR ENCODING AND DECODING A LOW DENSITY PARITY CHECK CODE WITH MAXIMUM ERROR CORRECTION AND ERROR DETECTION CAPABILITY

(75) Inventors: Seung-Hoon Choi, Suwon-si (KR);
Gyu-Bum Kyung, Seongnem-si (KR);
Hong-Sil Jeong, Suwon-si (KR);
Jae-Yoel Kim, Gunpo-si (KR)

(73) Assignee: Samsung Electronics Co., Ltd (KR)

( * ) Notice: Subject to any disclaimer, the term of this patent is extended or adjusted under 35 U.S.C. 154(b) by 1387 days.

(21) Appl. No.: 11/057,445

(22) Filed: Feb. 14, 2005

(65) Prior Publication Data
US 2005/0235195 A1    Oct. 20, 2005

(30) Foreign Application Priority Data
Feb. 13, 2004    (KR)    ............... 10-2004-0009681

(51) Int. Cl.
*H03M 13/00*    (2006.01)

(52) U.S. Cl. .............. 714/758; 714/800; 714/801; 714/E11.057; 714/E11.113

(58) Field of Classification Search ............ 714/758, 714/800, 801, E11.057, E11.113
See application file for complete search history.

(56) References Cited

U.S. PATENT DOCUMENTS

| | | | | |
|---|---|---|---|---|
| 4,486,882 A | * | 12/1984 | Piret et al. .................. | 714/788 |
| 4,546,474 A | * | 10/1985 | Sako et al. .................. | 714/756 |
| 5,023,710 A | * | 6/1991 | Kondo et al. ............ | 375/240.24 |
| 5,434,847 A | * | 7/1995 | Kou ............................ | 370/252 |
| 5,546,243 A | * | 8/1996 | Setoyama ..................... | 360/51 |
| 5,546,409 A | * | 8/1996 | Karasawa .................... | 714/755 |
| 6,675,349 B1 | * | 1/2004 | Chen .......................... | 714/804 |
| 6,957,375 B2 | * | 10/2005 | Richardson ................ | 714/752 |
| 7,013,116 B2 | * | 3/2006 | Ashikhmin et al. ......... | 455/214 |
| 7,162,684 B2 | * | 1/2007 | Hocevar ..................... | 714/800 |
| 7,231,557 B2 | * | 6/2007 | Jin et al. ..................... | 714/701 |
| 2002/0186759 A1 | * | 12/2002 | Goldstein et al. ........... | 375/222 |
| 2005/0166131 A1 | * | 7/2005 | Xia et al. .................... | 714/800 |

* cited by examiner

*Primary Examiner*—Scott T Baderman
*Assistant Examiner*—Enam Ahmed
(74) *Attorney, Agent, or Firm*—The Farrell Law Firm, LLP (57) ABSTRACT

An apparatus and method for decoding a Low Density Parity Check (LDPC) code having a maximum error correction capability and an error detection capability. In the apparatus, a decoder receives a signal, and decodes the received signal according to a second parity check matrix having parity check expressions obtained by selecting a predetermined number of dependent parity check expressions among dependent parity check expressions generated by combining, with a predetermined scheme, parity check expressions representing rows of a first parity check matrix obtained by encoding information data into a block code having an optimum minimum distance considering a predetermined coding rate, and adding the selected dependent parity check expressions to the parity check expressions of the first parity check matrix. An error detector determines if there is an error in a signal output from the decoder.

13 Claims, 8 Drawing Sheets

$$H = \begin{bmatrix} 1 & 1 & 1 & 1 & 1 & 1 & 1 & 1 & 1 & 1 & 1 & 1 & 1 & 1 & 1 & 1 \\ 0 & 1 & 0 & 1 & 0 & 1 & 0 & 1 & 0 & 1 & 0 & 1 & 0 & 1 & 0 & 1 \\ 0 & 0 & 1 & 1 & 0 & 0 & 1 & 1 & 0 & 0 & 1 & 1 & 0 & 0 & 1 & 1 \\ 0 & 0 & 0 & 0 & 1 & 1 & 1 & 1 & 0 & 0 & 0 & 0 & 1 & 1 & 1 & 1 \\ 0 & 0 & 0 & 0 & 0 & 0 & 0 & 0 & 1 & 1 & 1 & 1 & 1 & 1 & 1 & 1 \\ 0 & 0 & 0 & 1 & 0 & 0 & 0 & 1 & 0 & 0 & 0 & 1 & 0 & 0 & 0 & 1 \\ 0 & 0 & 0 & 0 & 0 & 1 & 0 & 1 & 0 & 0 & 0 & 0 & 0 & 1 & 0 & 1 \\ 0 & 0 & 0 & 0 & 0 & 0 & 0 & 0 & 0 & 1 & 0 & 1 & 0 & 1 & 0 & 1 \\ 0 & 0 & 0 & 0 & 0 & 0 & 1 & 1 & 0 & 0 & 0 & 0 & 0 & 0 & 1 & 1 \\ 0 & 0 & 0 & 0 & 0 & 0 & 0 & 0 & 0 & 0 & 1 & 1 & 0 & 0 & 1 & 1 \\ 0 & 0 & 0 & 0 & 0 & 0 & 0 & 0 & 0 & 0 & 0 & 0 & 1 & 1 & 1 & 1 \end{bmatrix}$$

FIG.3

$$H' = \begin{bmatrix} 0001000100010001 \\ 0000001100000011 \\ 0001001000010010 \\ 0000000000001111 \\ 0000110000000011 \\ 0000101000001010 \\ 0010100000101000 \\ 0000100100001001 \\ 0001100000011000 \\ 1010000010100000 \\ 0000000000110011 \\ 0010001000010001 \\ 0000110011000000 \\ 0100100010000100 \\ 1100001100000000 \\ 1100000000000011 \\ 1000001001000001 \\ 0000000001010101 \\ 0100010000010001 \\ 1010010100000000 \\ 0000010101010000 \\ 0001010001000001 \\ 0101000000001010 \\ 0000000011110000 \\ 0010100010000010 \\ 0000000011001100 \\ 0010001001000100 \\ 1001011000000000 \\ 0000011001100000 \\ 0100001000100100 \\ 0100000100101000 \\ 0000100101100000 \end{bmatrix}$$

APPARATUS AND METHOD FOR ENCODING AND DECODING A LOW DENSITY PARITY CHECK CODE WITH MAXIMUM ERROR CORRECTION AND ERROR DETECTION CAPABILITY

PRIORITY

This application claims priority under 35 U.S.C. §119 to an application entitled "Apparatus and Method for Encoding/Decoding Low Density Parity Check Code With Maximum Error Correction/Error Detection Capability" filed in the Korean Intellectual Property Office on Feb. 13, 2004 and assigned Serial No. 2004-9681, the contents of which are incorporated herein by reference.

BACKGROUND OF THE INVENTION

1. Field of the Invention

The present invention relates generally to a mobile communication system, and in particular, to an apparatus and method for encoding and decoding a Low Density Parity Check (LDPC) code having the maximum error correction capability and an error detection capability.

2. Description of the Related Art

Active research into a $4^{th}$ generation (4G) mobile communication system, which is the next generation mobile communication system, is being conducted to provide users with various qualities-of-service (QoS) at a data rate of about 100 Mbps. The 4G mobile communication system, unlike the earlier generation mobile communication systems, attempts to provide efficient interworking/convergence services between a wired communication network and a wireless communication network beyond the conventional simple radio communication service. Therefore, there is a demand for development of a technology capable of transmitting a large volume of data approximating a capacity of a wired communication network, even in a wireless communication network.

To improve system performance, it is necessary to increase system transmission efficiency using an appropriate channel coding scheme because there is a demand for a high-speed, high-capacity communication system capable of processing and transmitting a variety of information such as image and radio data beyond the early voice-oriented service. However, unlike a wired channel environment, a wireless channel environment existing in a mobile communication system inevitably suffers from errors caused by various reasons such as multipath interference, shadowing, propagation attenuation, time-varying noise, interference, fading, etc., thereby causing an information loss. The information loss seriously distorts actual transmission signals, reducing an entire performance of the mobile communication system. Generally, in order to reduce the information loss, various error-control techniques are used according to characteristics of channels to increase reliability of the mobile communication system. The most typical error-control technique uses an error correction code.

The error correction code is generally classified into a block code and a convolutional code according to the need of a memory in its encoding process. The conventional block code includes a Low Density Parity Check (LDPC) code on which a large amount of research is being carried out.

Generally, the error correction capability of the block code is closely related to a minimum distance $d_{min}$ of the block code. The minimum distance $d_{min}$ of the block code can be defined using a Hamming distance. The Hamming distance refers to the number of different elements between two random codewords, and in the block code, the minimum Hamming distance among all possible Hamming distances between codewords becomes the minimum distance. It is already well known to those skilled in the art that a block code with the minimum distance $d_{min}$ can correct all of a maximum of $$\frac{d_{min}-1}{2}$$

errors.

Figure 1:
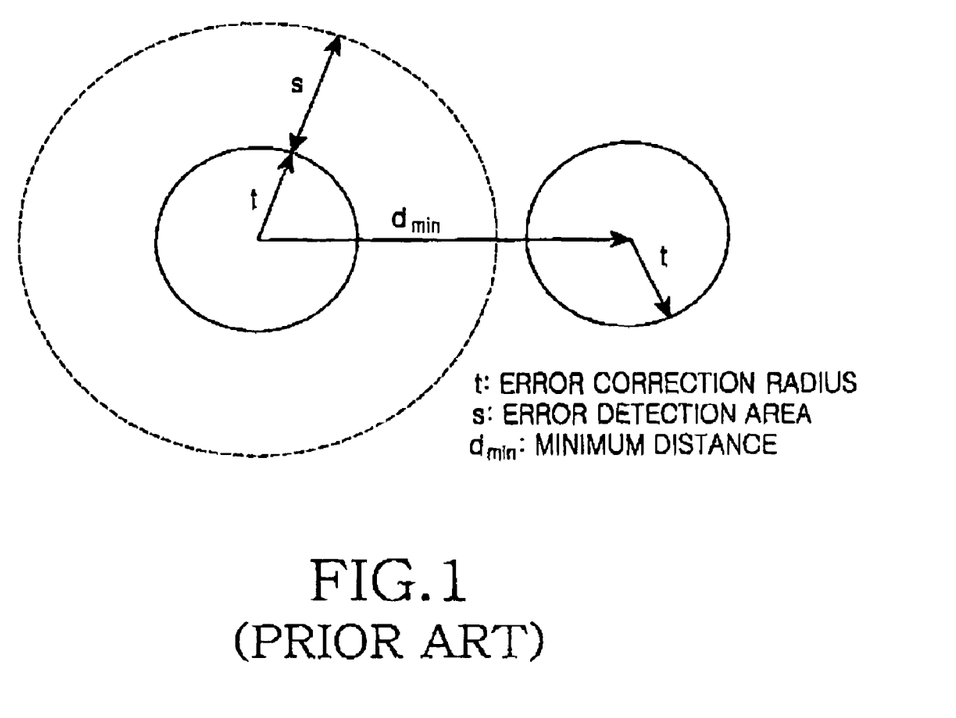
FIG. 1 is a diagram schematically illustrating a minimum distance between two random block codewords, an error correction capability, and an error detection capability.

FIG. 1 is a diagram schematically illustrating a minimum distance between two random block codewords, an error correction capability, and an error detection capability. Referring to FIG. 1, a transmitter generates a block codeword by encoding information data to be transmitted, and transmits the generated block codeword to a receiver over a radio channel. The receiver receives the block codeword including noises transmitted by the transmitter, and if a Hamming distance between the received signal and the block codeword transmitted by the transmitter is less than or equal to 't', an error of the received signal is corrected. Therefore, the received signal is decoded into the block codeword transmitted by the transmitter. Herein, 't' denotes an error-correctable Hamming distance. However, if a Hamming distance between the received signal and the block codeword transmitted by the transmitter is greater than 't' and is less than or equal to the minimum distance $d_{min}$, the received signal cannot be decoded into the block codeword transmitted by the transmitter. In this case, the receiver simply detects the presence of an error in the received signal.

In addition, when the Hamming distance between the received signal and the block codeword transmitted by the transmitter is greater than 't', the received signal is error-corrected into a block codeword that is totally different from the block codeword transmitted by the transmitter. As a result, the received signal is decoded into unreliable information data. Therefore, when a Hamming distance between two random block codewords is less than or equal to an error-correctable Hamming distance 't', error correction is possible, and when the Hamming distance between two random block codewords is greater than the error-correctable Hamming distance 't' and less than or equal to the minimum distance $d_{min}$, error correction is impossible, but error detection is possible. When the Hamming distance between two random block codewords is greater than the minimum distance $d_{min}$, both the error correction and the error detection are impossible.

However, because the minimum distance $d_{min}$ between two random block codes is a constant, an increase in a radius for error correction of the block code, i.e., an increase in error-correctable Hamming distance 't', reduces a radius for error detection of the block code. That is, an error correction capability of the block code is in inverse proportion to an error detection capability of the block code. Therefore, a scheme for adding Cyclic Redundancy Check (CRC) to the end of a block codeword to give an error detection capability while maintaining the error correction capability of the block codeword is generally used. A part for error detection, like the CRC, is an essential part necessary for preventing mis-operation of the system due to an error of a block codeword possibly occurring after a decoding process of the block codeword. However, because the CRC addition scheme reduces a coding rate of the block code, it is not possible to use the CRC for error detection in a communication system requiring a high coding rate. Accordingly, there is a demand for a block code having an error detection capability while maintaining the error correction capability.

SUMMARY OF THE INVENTION

It is, therefore, an object of the present invention to provide an apparatus and method for encoding and decoding an LDPC code having a good error correction capability and an error detection capability in a mobile communication system.

It is another object of the present invention to provide an apparatus and method for encoding and decoding an LDPC code using a block code with a short length in a mobile communication system.

It is further another object of the present invention to provide a method for designing a parity check matrix of an LDPC code having an error detection capability while maintaining a good error correction capability in a mobile communication system.

According to a first aspect of the present invention, there is provided an apparatus for encoding a Low Density Parity Check (LDPC) code having a good error correction capability and an error detection capability. The apparatus includes an encoder for receiving information data, and generating the LDPC code by encoding the information data according to a parity check matrix determined based on a predetermined coding rate. The parity check matrix has parity check expressions obtained by selecting a predetermined number of dependent parity check expressions among dependent parity check expressions generated by combining, with a predetermined scheme, parity check expressions representing rows of a first parity check matrix for encoding the information data into a block code having an optimum minimum distance considering the coding rate, and adding the selected dependent parity check expressions to the parity check expressions of the first parity check matrix.

According to a second aspect of the present invention, there is provided an apparatus for decoding a Low Density Parity Check (LDPC) code having a good error correction capability and an error detection capability. The apparatus includes a decoder for receiving a signal, and decoding the received signal according to a second parity check matrix having parity check expressions obtained by selecting a predetermined number of dependent parity check expressions among dependent parity check expressions generated by combining, with a predetermined scheme, parity check expressions representing rows of a first parity check matrix obtained by encoding information data into a block code having an optimum minimum distance considering a predetermined coding rate, and adding the selected dependent parity check expressions to the parity check expressions of the first parity check matrix; and an error detector for determining whether there is an error in a signal output from the decoder.

According to a third aspect of the present invention, there is provided a method for generating a parity check matrix of a Low Density Parity Check (LDPC) code having a good error correction capability and an error detection capability. The method includes the steps of detecting a first parity check matrix for encoding information data into a block code having an optimum minimum distance considering a predetermined coding rate; generating dependent parity check expressions by combining parity check expressions representing rows of the first parity check matrix using a predetermined scheme, and selecting a predetermined number of dependent parity check expressions among the generated dependent parity check expressions; and generating a second parity check matrix having parity check expressions obtained by adding the selected dependent parity check expressions to the parity check expressions of the first parity check matrix.

According to a fourth aspect of the present invention, there is provided a method for encoding a Low Density Parity Check (LDPC) code having a good error correction capability and an error detection capability. The method includes the steps of receiving information data; and generating the LDPC code by encoding the information data according to a parity check matrix determined based on a predetermined coding rate. The parity check matrix has parity check expressions obtained by selecting a predetermined number of dependent parity check expressions among dependent parity check expressions generated by combining, with a predetermined scheme, parity check expressions representing rows of a first parity check matrix for encoding the information data into a block code having an optimum minimum distance considering the coding rate, and adding the selected dependent parity check expressions to the parity check expressions of the first parity check matrix.

According to a fifth aspect of the present invention, there is provided a method for decoding a Low Density Parity Check (LDPC) code having a good error correction capability and an error detection capability. The method includes the steps of generating a second parity check matrix having parity check expressions obtained by selecting a predetermined number of dependent parity check expressions among dependent parity check expressions generated by combining, with a predetermined scheme, parity check expressions representing rows of a first parity check matrix obtained by encoding information data into a block code having an optimum minimum distance considering a predetermined coding rate, and adding the selected dependent parity check expressions to the parity check expressions of the first parity check matrix; upon receiving a signal, decoding the received signal according to the second parity check matrix; determining whether there is an error in the decoded signal; if it is determined that there is no error, outputting the decoded signal as restored information data, and outputting information indicating the absence of an error in the received signal; and if it is determined that there is an error, discarding the decoded signal and outputting information indicating the presence of an error in the received signal.

BRIEF DESCRIPTION OF THE DRAWINGS

The above and other objects, features, and advantages of the present invention will become more apparent from the following detailed description when taken in conjunction with the accompanying drawings in which.

DETAILED DESCRIPTION OF THE PREFERRED EMBODIMENT

Preferred embodiments of the present invention will now be described in detail herein below with reference to the annexed drawings. In the following description, a detailed description of known functions and configurations incorporated herein has been omitted for conciseness.

The present invention proposes a scheme for encoding and decoding a short-block Low Density Parity Check (LDPC) code having an error detection capability without a reduction in an error correction capability, i.e., while maintaining the maximum error correction capability. In particular, the present invention proposes a parity check matrix of a short-block LDPC code having the maximum error correction capability and error detection capability.

An error correction capability of the block code is in proportion to a minimum distance $d_{min}$ of the block code. Therefore, in order to increase the error correction capability of the block code, it is necessary to increase the minimum distance $d_{min}$ and perform decoding using a Maximum Likelihood (ML) decoding method. However, the ML decoding method should accept a reduction in error correction capability in order to have a capability for detecting a frame error, i.e., an error detecting capability, while maintaining the error correcting capability of the block code during a decoding process.

An LDPC code is typical block code, and the LDPC code is advantageous in that although a common block code is used, it can have the error detection capability while maximizing the error correction capability. In addition, because the LDPC code is very small in number of 1s in its parity check matrix, i.e., because a weight of the parity check matrix is very low, even though its length is very long, it can be decoded through iterative decoding, and as the length increases longer, it shows performance approximating Shannon's channel capacity limit, like a turbo code. Here, the "Shannon's channel capacity limit" refers to a channel capacity corresponding to Shannon's channel coding theorem, and the Shannon's channel coding theorem proves that possible reliable communication is limited to a data rate not exceeding the channel capacity. In the Shannon's channel coding theorem, a random block code having a very big block size has performance approximating the channel capacity limit.

However, because an LDPC code proposed in the present invention is a short-block LDPC code, it, unlike the conventional LDPC code, is characterized in that its block length is very short, i.e., a length of its codeword is very short. It is known that a reduction in block length deteriorates performance of the LDPC code. Therefore, the present invention proposes the following two schemes in order to overcome a reduction in error correction capability due to the short block length of the short-block LDPC code.

First Scheme

A block code having an optimum minimum distance is selected as a block code to be applied to a short-block LDPC code.

Second Scheme

Parity check expressions are added to a parity check matrix of the selected block code, thereby increasing a length of the parity check matrix.

The first scheme is taken into consideration because an error correction capability of a block code is in proportion to a minimum distance of the block code as described above, and is used to increase a basic error correction capability of the short-block LDPC code. For an [n, k] block code having a short block, because there are many known codes having an optimum minimum distance, any one of the codes is selected to increase the basic error correction capability of the short-block LDPC code.

As described above, a conventional LDPC code has an error correction capability approximating Shannon's channel capacity limit only for a long-block LDPC code in its iterative decoding process. However, compared with the long-block LDPC code, the short-block LDPC code decreases in error correction capability due to its short block length, and therefore, the second scheme is used to prevent a reduction in the error correction capability by increasing the number of parity check expressions added to the parity check matrix.

Figure 2:
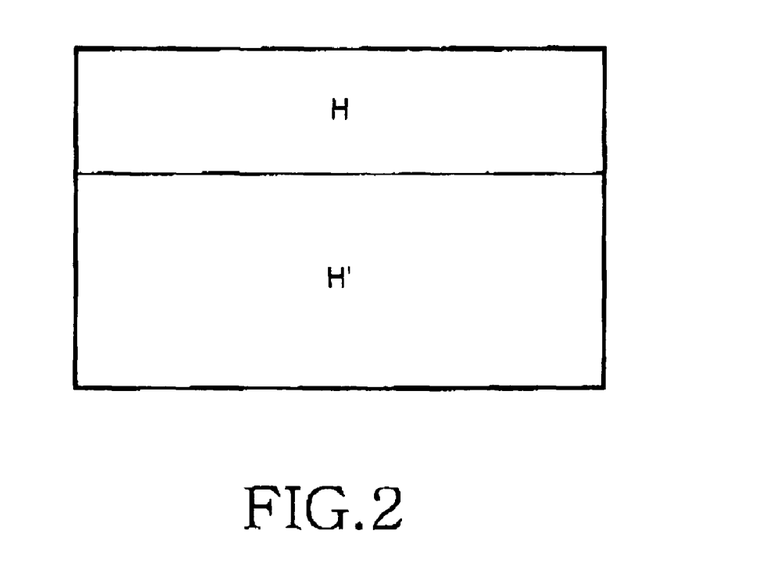
FIG. 2 is a diagram illustrating a parity check matrix of a short-block LDPC code according to an embodiment of the present invention.

FIG. 2 is a diagram illustrating a parity check matrix of a short-block LDPC code according to an embodiment of the present invention. More specifically, an operation of applying the second scheme to encoding of the short-block LDPC code will be described with reference to the parity check matrix illustrated in FIG. 2.

Generally, an LDPC code is designed such that its parity check matrix has a full rank because an increase in number of independent parity check expressions contributes to an increase in error correction capability of the LDPC code. Therefore, in order to increase the number of parity check expressions of the parity check matrix while maintaining a full rank, the short-block LDPC code should be designed by adding dependent parity check expressions to the original parity check expressions of the parity check matrix.

In FIG. 2, H denotes the original parity check expressions of the short-block LDPC code, and H' denotes dependent parity check expressions generated using the original parity check expressions of the short-block LDPC code. When the number of parity check expressions added to the parity check matrix increases, its calculation load may increase, but the increase in calculation load does not affect actual implementation because of the short block length of the short-block LDPC code.

Figure 3:
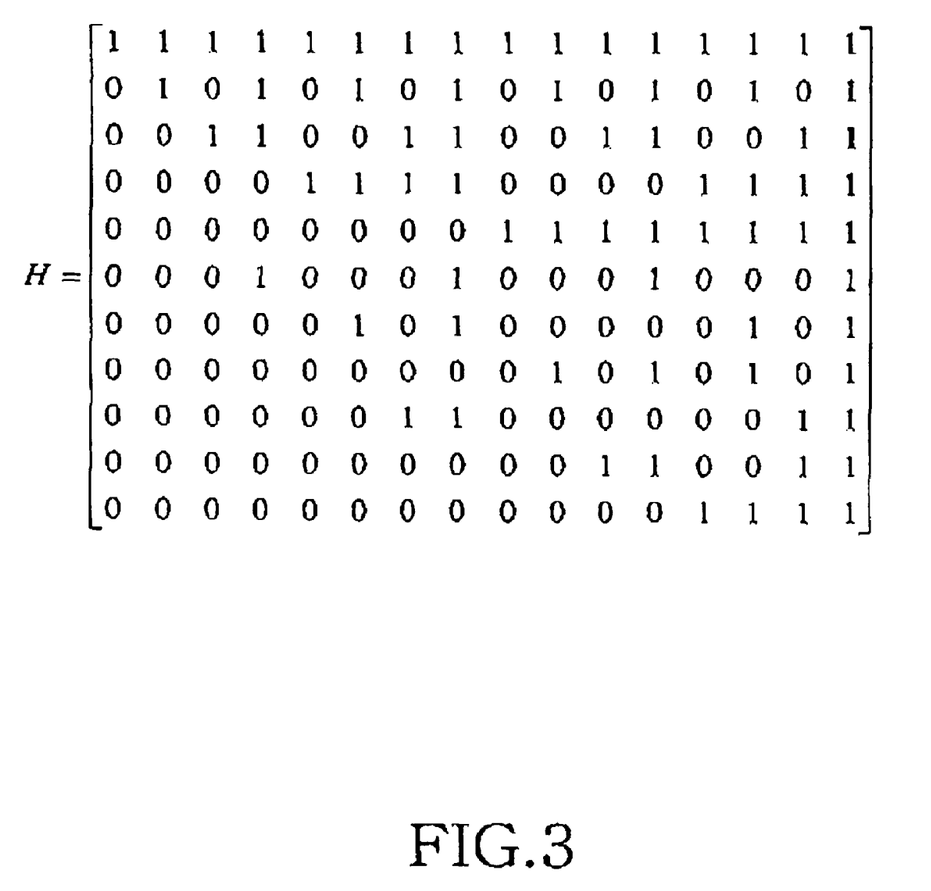
FIG. 3 is a diagram illustrating original parity check expressions included in a parity check matrix of a general [16, 5] Reed-Muller (RM) code.
Figure 4:
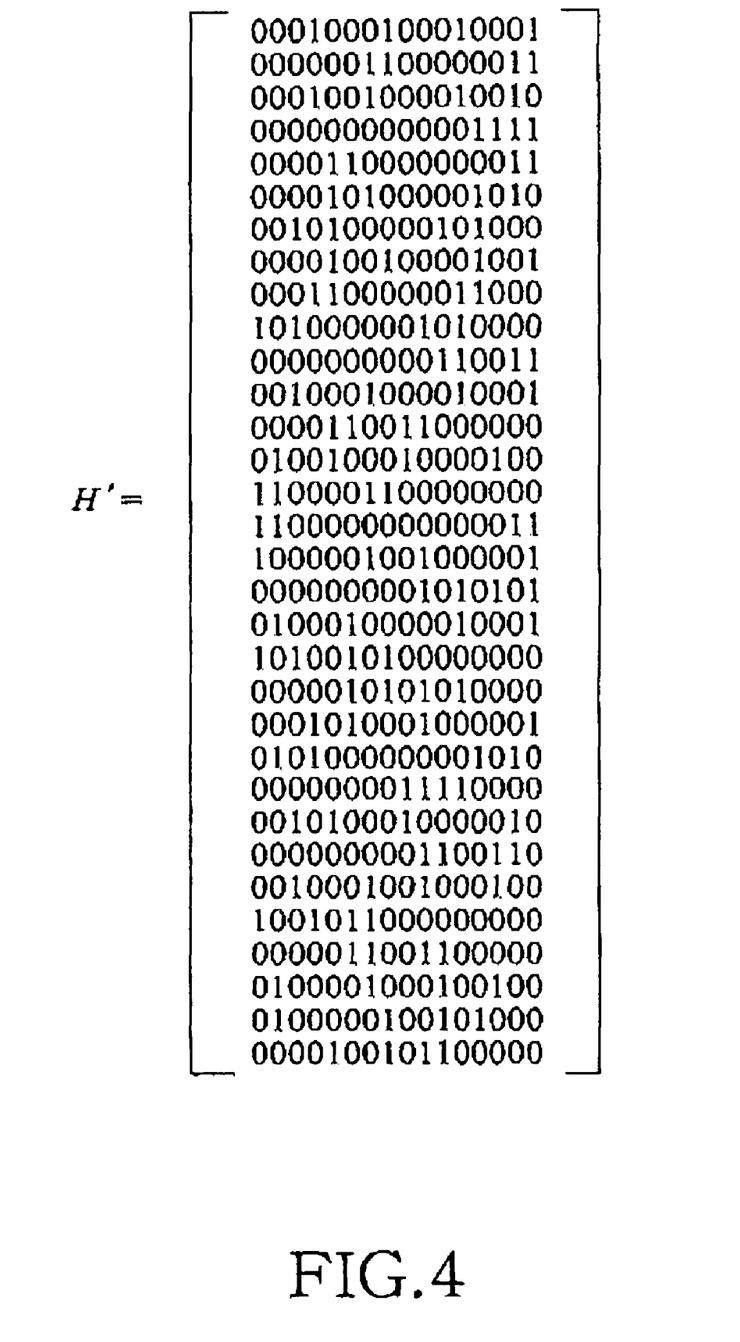
FIG. 4 is a diagram illustrating dependent parity check expressions included in the parity check matrix of the [16, 5] Reed-Muller code.

FIG. 3 is a diagram illustrating original parity check expressions included in a parity check matrix of a general [16, 5] Reed-Muller code, and FIG. 4 is a diagram illustrating dependent parity check expressions included in the parity check matrix of the [16, 5] Reed-Muller code.

Referring to FIG. 3, a parity check matrix of the [16, 5] Reed-Muller code is an 11×16 matrix, and the parity check matrix has 11 parity check expressions, which are rows of the parity check matrix. FIG. 4 illustrates dependent parity check expressions of the parity check matrix of the [16, 5] Reed-Muller code, obtained by performing modulo-2 addition for each column on the original parity check expressions of the parity check matrix of the [16, 5] Reed-Muller code, i.e., different rows of the parity check matrix of the [16, 5] Reed-Muller code, illustrated in FIG. 3, and selecting the modulo-2 addition results.

Herein below a description will now be made of a scheme for selecting dependent parity check expressions of the parity check matrix of the [16, 5] Reed-Muller code.

A total of 2048 dependent rows are obtained by performing modulo-2 addition for each column on 11 basis rows of the parity check matrix of the [16, 5] Reed-Muller code as described above. However, because the LDPC code is characterized in that the number of 1s in its parity check matrix is small, i.e., a weight of its parity check matrix is low, the dependent parity expresses are generated by selecting only lower-weight rows from the 2048 dependent rows. The H' illustrated in FIG. 4 is generated by sequentially selecting a predetermined number of dependent parity check expressions among the generated dependent parity check expressions beginning from a dependent parity check expression with a minimum weight. The weight refers to the number of non-zero elements in a row or a column. In FIG. 4, the dependent parity check expressions are generated by selecting 32 rows each of which has a weight of 4.

Figure 5:
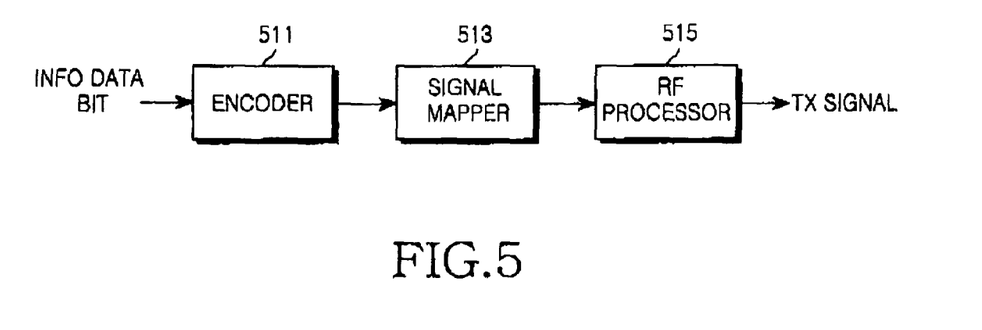
FIG. 5 is a block diagram illustrating a structure of a transmitter in a mobile communication system according to an embodiment of the present invention.

FIG. 5 is a block diagram illustrating a transmitter in a mobile communication system according to an embodiment of the present invention. Referring to FIG. 5, the transmitter includes an encoder 511, a signal mapper 513, and a radio frequency (RF) processor 515. Upon receiving information data, the encoder 511 generates a coded symbol, i.e., a short-block LDPC codeword, by encoding the information data with a predetermined encoding scheme, i.e., according to a predetermined generation matrix, and outputs the short-block LDPC code to the signal mapper 513. Here, the encoding scheme represents an encoding scheme for generating a short-block LDPC code according to an embodiment of the present invention, and block-encodes the information data such that the information data has an optimum minimum distance and corresponds to a parity check matrix in which the original parity check expressions and also dependent parity check expressions are added.

The signal mapper 513 signal-maps the short-block LDPC codeword output from the encoder 511 with a predetermined signal mapping scheme, such as Binary Phase Shift Keying (BPSK), Quadrature Phase Shift Keying (QPSK), or 8-ary Quadrature Amplitude Modulation (8QAM), and outputs the signal-mapped short-block LDPC codeword to the RF processor 515. The RF processor 515 including a digital-to-analog (D/A) converter, a filter and a front-end unit, analog-converts a digital signal output from the signal mapper 513, and RF-processes the analog-converted signal such that it can be transmitted over the air via a transmission antenna (not shown).

Figure 6:
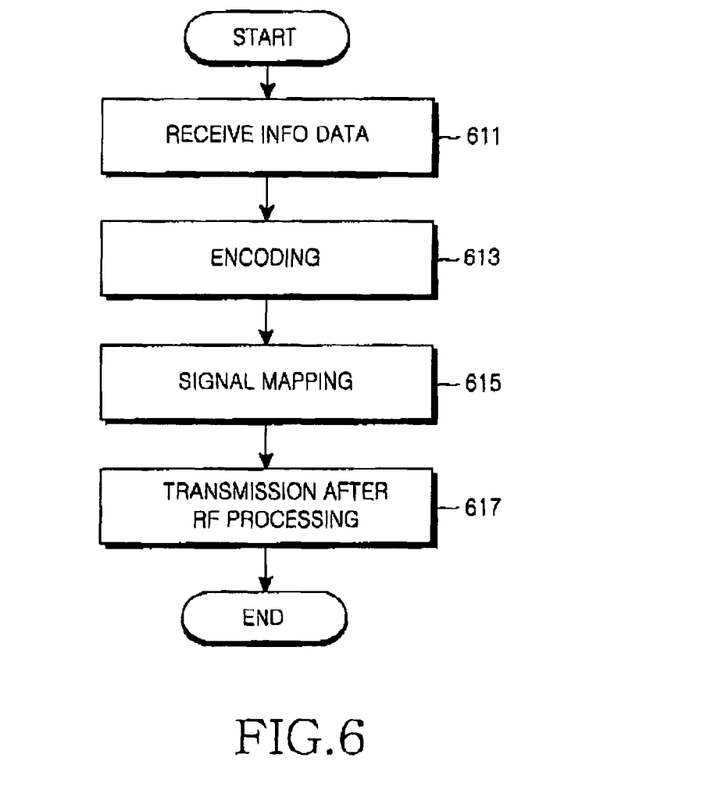
FIG. 6 is a flowchart illustrating an operation of the transmitter illustrated in FIG. 5.

FIG. 6 is a flowchart illustrating an operation of the transmitter illustrated in FIG. 5. Referring to FIG. 6, in step 611, the transmitter receives information data to be transmitted. In step 613, the transmitter encodes the received information data into a short-block LDPC codeword with a predetermined encoding scheme. The operation of generating the information data into the short-block LDPC codeword has been described with reference to FIG. 5.

In step 615, the transmitter signal-maps the short-block LDPC codeword with a predetermined signal mapping scheme, and in step 617, the transmitter RF-processes the signal-mapped signal and transmits the RF-processed signal using a radio channel.

Figure 7:
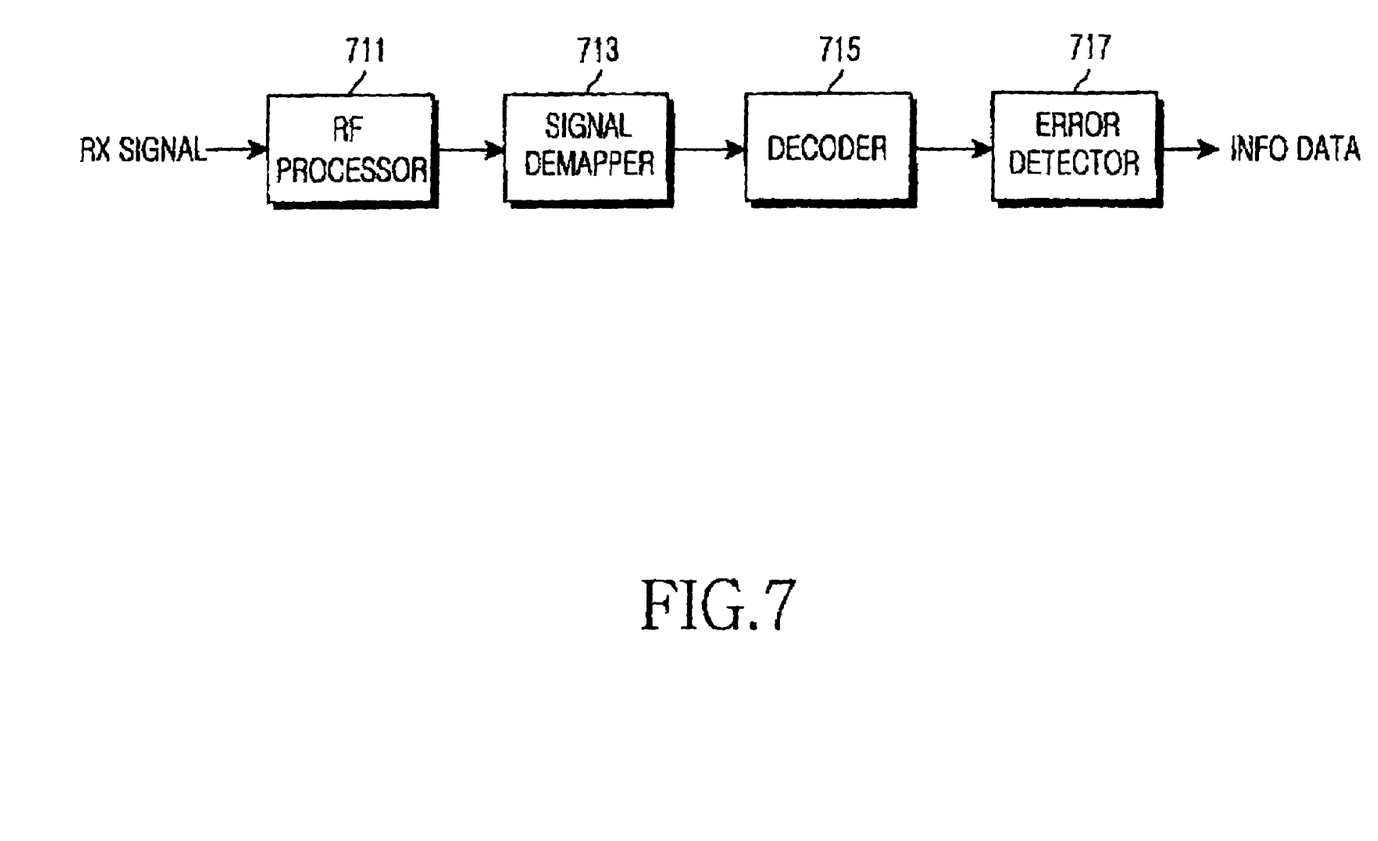
FIG. 7 is a block diagram schematically illustrating a receiver in a mobile communication system according to an embodiment of the present invention.

FIG. 7 is a block diagram schematically illustrating a receiver in a mobile communication system according to an embodiment of the present invention. Referring to FIG. 7, the receiver includes an RF processor 711, a signal demapper 713, a decoder 715, and an error detector 717. The signal transmitted by the transmitter as described with reference to FIG. 5 is received at the receiver via a reception antenna, and is then input to the RF processor 711. The RF processor 711 down-converts the analog signal received through the reception antenna into an intermediate frequency (IF) signal, digital-converts the IF signal, and outputs the digital-converted IF signal to the signal demapper 713. The signal demapper 713 signal-demaps the signal output from the RF processor 711 with a predetermined signal demapping scheme corresponding to the signal mapping scheme used in the transmitter, and outputs the signal-demapped signal to the decoder 715. The decoder 715 decodes the signal output from the signal demapper 713 with a decoding scheme corresponding to the encoding scheme used in the transmitter, and outputs the decoded signal to the error detector 717.

The decoder 715 performs decoding according to a parity check matrix in which the original parity check expressions and also dependent parity check expressions are added as described above. A more detailed description of decoding process will be made below.

The error detector 717 determines if there is an error in the signal output from the decoder 715. If it is determined that there is an error in the input signal, the error detector 717 discards the defective signal. However, if it is determined that there is no error in the signal output from the decoder 715, the error detector 717 restores the signal output from the decoder 715 into final information data. The error detector 717 determines if there is an error in the signal output from the decoder 715 using a check-sum algorithm on a factor graph of the short-block LDPC code. The operation of determining the presence/absence of an error will be described in detail below.

Figure 8:
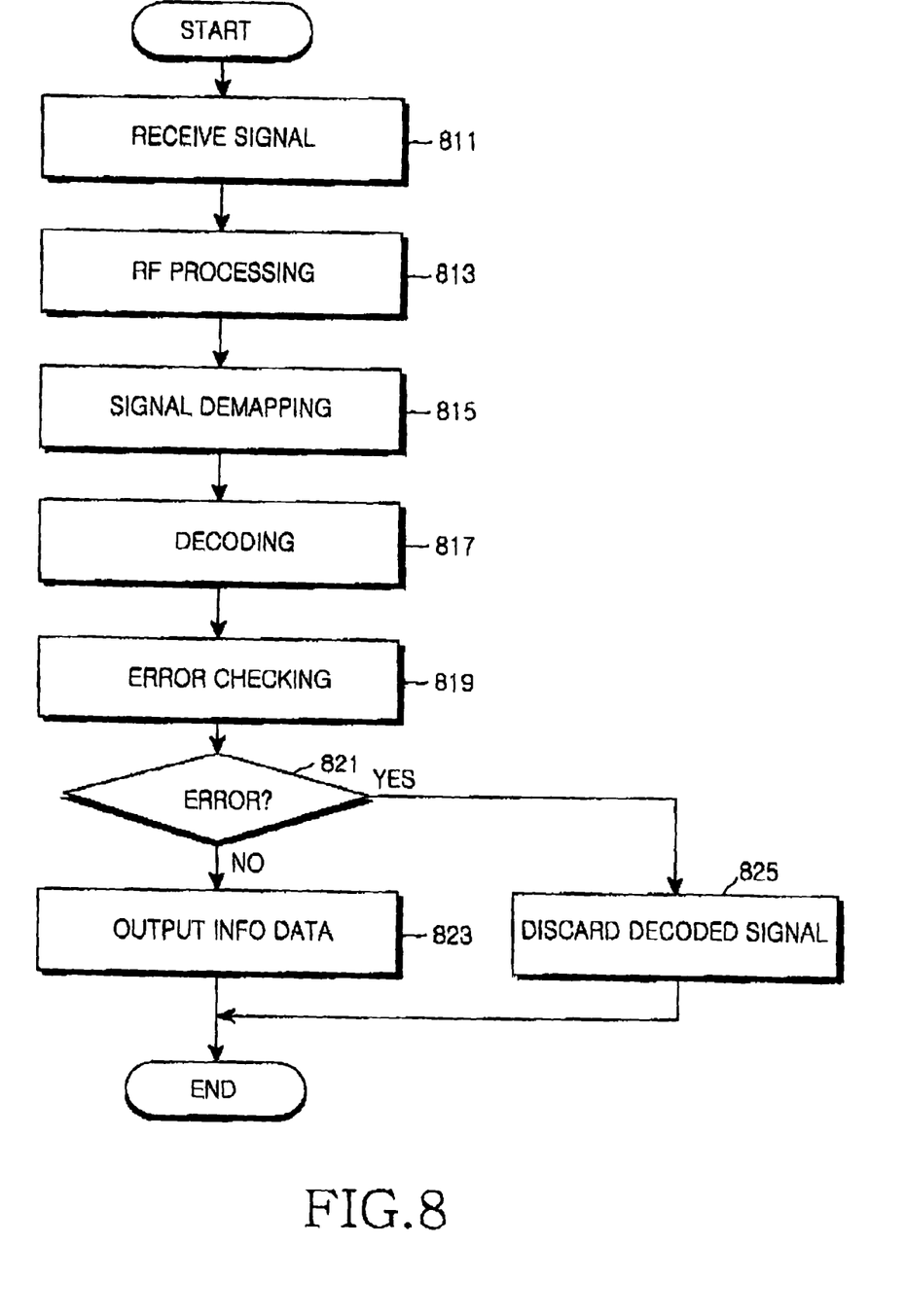
FIG. 8 is a flowchart illustrating an operation of the receiver illustrated in FIG. 7.

FIG. 8 is a flowchart illustrating an operation of the receiver illustrated in FIG. 7. Referring to FIG. 8, in step 811, the receiver receives a signal via a reception antenna, and in step 813, the receiver RF-processes the received signal. In step 815, the receiver signal-demaps the RF-processed signal with a signal demapping scheme corresponding to the signal mapping scheme used in its associated transmitter, and then in step 817, the receiver decodes the signal-demapped signal with a decoding scheme corresponding to the encoding scheme used in the transmitter. The operation of decoding the signal-demapped signal has been described with reference to FIG. 7.

In step 819, the receiver performs error checking in the decoded signal. If it is determined in step 821 that there is no error in the decoded signal, the receiver proceeds to step 823. In step 823, the receiver outputs the decoded signal as final information data. However, if it is determined in step 821 that there is an error in the decoded signal, the receiver proceeds to step 825. In step 825, the receiver discards the decoded signal and ends the procedure.

Figure 9:
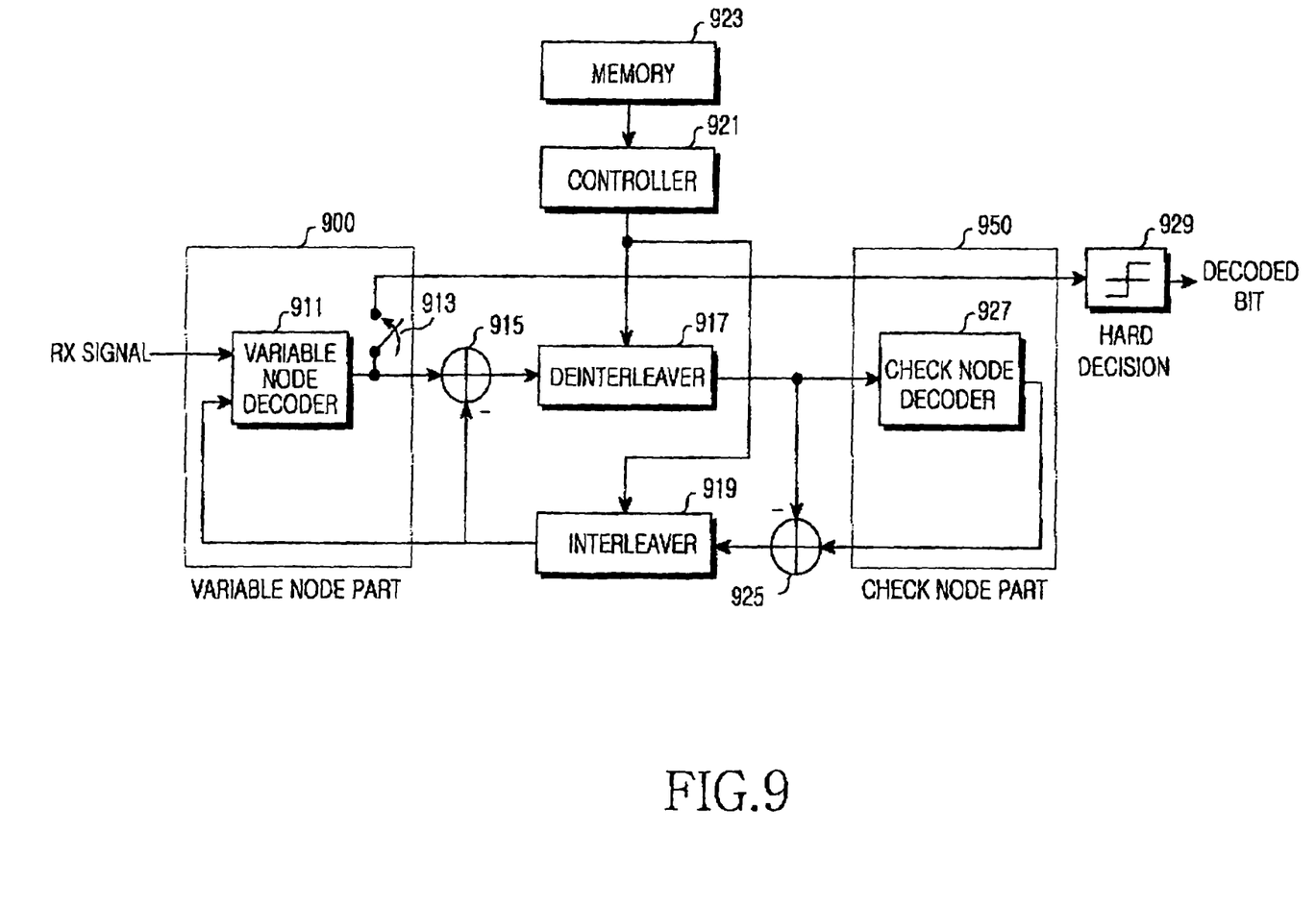
FIG. 9 is a block diagram illustrating a detailed structure of the decoder illustrated in FIG. 7.

FIG. 9 is a block diagram illustrating a detailed structure of the decoder 715 illustrated in FIG. 7. Referring to FIG. 9, the decoder 715 includes a variable node part 900, a subtractor 915, a deinterleaver 917, an interleaver 919, a controller 921, a memory 923, a subtractor 925, a check node part 950, and a hard-decision unit 929. The variable node part 900 includes a variable node decoder 911 and a switch 913, and the check node part 950 includes a check node decoder 927.

A reception signal received over a radio channel is input to the variable node decoder 911 in the variable node part 900, and the variable node decoder 911 calculates probability values of the reception signal, updates the calculated probability values, and outputs the updated probability values to the switch 913 and the subtractor 915. The variable node decoder 911 connects variable nodes according to a parity check matrix previously set in the decoder 915, and performs update calculations having as many input and output values as the number of 1s connected to the variable nodes. Here, the parity check matrix is formed such that the original parity check expressions and also dependent parity check expressions are added as described above. The number of 1s connected to each of the variable nodes is identical to a weight of each of the columns included in the parity check matrix. Therefore, internal calculation of the variable node decoder 911 is different according to a weight of each of the columns included in the parity check matrix.

The subtractor 915 receives a signal output from the variable node decoder 911 and an output signal of the interleaver 919 in a previous iterative decoding process, subtracts the output signal of the interleaver 919 in the previous iterative decoding from the signal output from the variable node decoder 911, and outputs the subtraction result to the deinterleaver 917. If the decoding process is an initial decoding process, the output signal of the interleaver 919 should be regarded as '0'.

The deinterleaver 917 deinterleaves a signal output from the subtractor 915 according to a predetermined scheme, and outputs the deinterleaved signal to the subtractor 925 and the check node decoder 927. The deinterleaver 917 has an internal structure corresponding to the parity check matrix, because an output value for an input value of the interleaver 919 corresponding to the deinterleaver 917 becomes different according to positions of elements having a value of 1 in the parity check matrix.

The subtractor 925 receives an output signal of the check node decoder 927 in a previous iterative decoding process and an output signal of the deinterleaver 917, subtracts the output signal of the deinterleaver 917 from the output signal of the check node decoder 927 in the previous iterative decoding process, and outputs the subtraction result to the interleaver 919. The check node decoder 927 connects check nodes according to a parity check matrix previously set in the decoding apparatus for the block LDPC code, and performs update calculations having as many input and output values as the number of 1s connected to the check nodes. The number of 1s connected to each of the check nodes is identical to a weight of each of the rows included in the parity check matrix. Therefore, internal calculation of the check node decoder 927 is different according to a weight of each of the rows included in the parity check matrix.

The interleaver 919, under the control of the controller 921, interleaves a signal output from the subtractor 925 according to a predetermined scheme, and outputs the interleaved signal to the subtractor 915 and the variable node decoder 911. The controller 921 reads interleaving scheme-related information stored in the memory 923 and controls an interleaving scheme of the interleaver 919 according to the read interleaving scheme-related information. If the decoding process is an initial decoding process, an output signal of the deinterleaver 917 should be regarded as '0'.

By repeatedly performing the above processes, the decoder 715 secures error-free high-reliability decoding, and after the decoder 715 performs iterative decoding as many times as a predetermined number of iterations, the switch 913 switches-off the variable node decoder 911 from the subtractor 915. Simultaneously, the decoder 715 switches-on the variable node decoder 911 to the hard-decision unit 929 such that the signal output from the variable node decoder 911 is output to the hard-decision unit 929. The hard-decision unit 929 makes a hard decision on the signal output from the variable node decoder 911 and outputs the hard-decision result. An output value of the hard-decision unit 929 becomes a finally decoded value.

Figure 10:
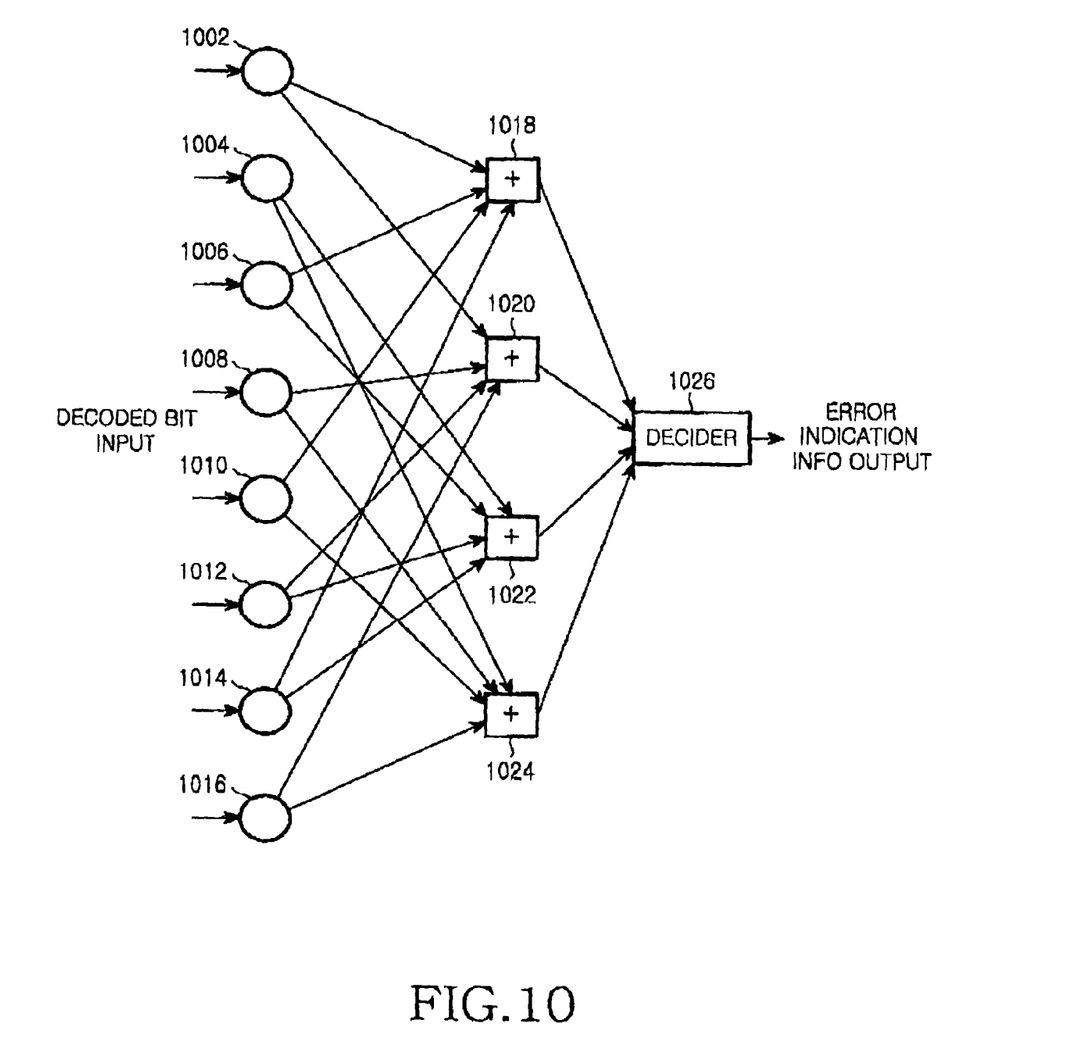
FIG. 10 is a detailed structure of the error detector illustrated in FIG. 7.

FIG. 10 is a detailed structure of the error detector 717 illustrated in FIG. 7. Referring to FIG. 10, the error detector 717 includes a plurality of variable nodes 1002 to 1016, a plurality of check nodes 1018 to 1024, a plurality of edges for connecting the variable nodes 1002 to 1016 to the check nodes 1018 to 1024, and a decider 1026. An output signal of the hard-decision unit 929, i.e., each of decoded codeword bits, is stored in the variable nodes 1002 to 1016. Then, the check nodes 1018 to 1024 perform a check-sum algorithm on the values stored in the variable nodes 1002 to 1016, and output the check-sum results to the decider 1026.

When all of the result values output from the check nodes 1018 to 1024 are 0, the decider 1026 restores the output signal of the hard-decision unit 929 into final information data, thereby determining that there is no error in the codeword bits stored in the variable nodes 1002 to 1016. Thereafter, the decider 1026 outputs information indicating the absence of an error in the received signal. However, if any one of the result values output from the check nodes 1018 to 1024 has a non-zero value, the decider 1026 discards the output signal of the hard-decision unit 929, determining that there is an error in the codeword bits stored in the variable nodes 1002 to 1016, and outputs information indicating the presence of an error in the received signal.

As described above, the present invention proposes a parity check matrix in which parity check expressions are added, thereby preventing deterioration in an error correction capability caused by the short block size of the short-block LDPC code. The proposal of the parity check matrix in which parity check expressions are added enables the short-block LDPC code to have an error detection capability while maintaining its maximum error correction capability, thereby improving reliability of transmission signals.

While the present invention has been shown and described with reference to certain preferred embodiments thereof, it will be understood by those skilled in the art that various changes in form and details may be made therein without departing from the spirit and scope of the present invention as defined by the appended claims.

What is claimed is:

1. A method for generating a parity check matrix of a Low Density Parity Check (LDPC) code having a good error correction capability and an error detection capability, the method comprising:

generating a first parity check matrix having an optimum minimum distance considering a predetermined coding rate;

generating dependent parity check expressions by combining parity check expressions representing rows of the first parity check matrix using a predetermined scheme;

sequentially selecting a predetermined number of dependent parity check expressions among the generated dependent parity check expressions beginning with a dependent parity check expression having a minimum weight; and generating a second parity check matrix having parity check expressions comprising the selected dependent parity check expressions and the parity check expressions of the first parity check matrix;

decoding a signal using the second parity check matrix;

determining if there is an error in the decoded signal;

if it is determined that there is no error, outputting the decoded signal as restored information data, and outputting information indicating an absence of an error in the signal; and if it is determined that there is an error, discarding the decoded signal and outputting information indicating the presence of an error in the signal.

2. The method of claim 1, wherein the predetermined scheme performs modulo-2addition on the parity check expressions for each column of the first parity check matrix.

3. A method for encoding a Low Density Parity Check (LDPC) code having a good error correction capability and an error detection capability, the method comprising:

generating a codeword by encoding information data using a parity check matrix determined based on a predetermined coding rate;

wherein the parity check matrix is obtained by generating a first parity check matrix having an optimum minimum distance considering a predetermined coding rate, generating dependent parity check expressions by combining parity check expressions representing rows of the first parity check matrix using a predetermined scheme, sequentially selecting a predetermined number of dependent parity check expressions among the generated dependent parity check expressions beginning with a dependent parity check expression having a minimum weight, and generating the parity check matrix having parity check expressions comprising the selected dependent parity check expressions and the parity check expressions of the first parity check matrix; and wherein a signal is decoded using the parity check matrix, it is determined if there is an error in the decoded signal, the decoded signal is output as restored information data and information indicating an absence of an error in the signal is output when it is determined that there is no error, the decoded signal is discarded and information indicating the presence of an error in the signal is output when it is determined that there is an error.

4. The method of claim 3, wherein the predetermined scheme performs modulo-2 addition on the parity check expressions for each column of the first parity check matrix.

5. A method for decoding a Low Density Parity Check (LDPC) code having a good error correction capability and an error detection capability, the method comprising:

generating a first parity check matrix having an optimum minimum distance considering a predetermined coding rate, generating dependent parity check expressions by combining parity check expressions representing rows of the first parity check matrix using a predetermined scheme, sequentially selecting a predetermined number of dependent parity check expressions among the generated dependent parity check expressions beginning with a dependent parity check expression having a minimum weight, and generating a second parity check matrix having parity check expressions comprising the selected dependent parity check expressions and the parity check expressions of the first parity check matrix;

a signal using the second parity check matrix;

determining if there is an error in the decoded signal;

if it is determined that there is no error, outputting the decoded signal as restored information data, and outputting information indicating an absence of an error in the signal; and if it is determined that there is an error, discarding the decoded signal and outputting information indicating the presence of an error in the signal.

6. The method of claim 5, wherein the predetermined scheme performs modulo-2 addition on the parity check expressions for each column of the first parity check matrix.

7. The method of claim 5, wherein the decoding step comprises:

calculating probability values of the received signal;

generating a first signal by subtracting a signal generated in a previous decoding process from the calculated probability values;

deinterleaving the first signal with a deinterleaving scheme corresponding to the second parity check matrix;

detecting the calculated probability values from the deinterleaved signal;

generating a second signal by subtracting the deinterleaved signal from the detected probability values;

interleaving the second signal with an interleaving scheme corresponding to the second parity check matrix; and iterative-decoding the interleaved signal.

8. An apparatus for encoding a Low Density Parity Check (LDPC) code having a good error correction capability and an error detection capability, the apparatus comprising an encoder for generating the LDPC code by encoding information data using a parity check matrix determined based on a predetermined coding rate;

wherein the parity check matrix is obtained by generating a first parity check matrix having an optimum minimum distance considering a predetermined coding rate, generating dependent parity check expressions by combining parity check expressions representing rows of the first parity check matrix using a predetermined scheme, sequentially selecting a predetermined number of dependent parity check expressions among the generated dependent parity check expressions beginning with a dependent parity check expression having a minimum weight, and generating the parity check matrix having parity check expressions comprising the selected dependent parity check expressions and the parity check expressions of the first parity check matrix; and wherein a signal is decoded using the parity check matrix, it is determined if there is an error in the decoded signal, the decoded signal is output as restored information data and information indicating an absence of an error in the signal is output when it is determined that there is no error, the decoded signal is discarded and information indicating the presence of an error in the signal is output when it is determined that there is an error.

9. The apparatus of claim 8, wherein the predetermined scheme performs modulo-2 addition on the parity check expressions for each column of the first parity check matrix.

10. An apparatus for decoding a Low Density Parity Check (LDPC) code having a good error correction capability and an error detection capability, the apparatus comprising:

a decoder for decoding a signal using a second parity check matrix obtained by generating a first parity check matrix having an optimum minimum distance considering a predetermined coding rate, generating dependent parity check expressions by combining parity check expressions representing rows of the first parity check matrix using a predetermined scheme, sequentially selecting a predetermined number of dependent parity check expressions among the generated dependent parity check expressions beginning with a dependent parity check expression having a minimum weight, and generating the second parity check matrix having parity check expressions comprising the selected dependent parity check expressions and the parity check expressions of the first parity check matrix, and an error detector for determining if there is an error in a signal output from the decoder.

11. The apparatus of claim 10, wherein the decoder comprises:

a variable node decoder for connecting variable nodes according to a weight of each of columns constituting the second parity check matrix and calculating probability values of the received signal;

a first subtractor for subtracting a signal generated in a previous decoding process from an output signal of the variable node decoder;

a deinterleaver for deinterleaving an output signal of the first subtractor with a deinterleaving scheme determined according to the second parity check matrix;

a check node decoder for connecting check nodes according to a weight of each of rows included in the second parity check matrix and detecting probability values of an output signal of the deinterleaver;

a second subtractor for subtracting an output signal of the deinterleaver from an output signal of the check node decoder;

an interleaver for interleaving an output signal of the second subtractor with an interleaving scheme determined according to the second parity check matrix, and outputting the interleaving result to the variable node decoder and the first subtractor; and a controller for generating the second parity check matrix, and controlling the deinterleaving scheme and the interleaving scheme according to the second parity check matrix.

12. The apparatus of claim 10, wherein the error detector comprises:

if there is no error in an output signal of the decoder, outputting the decoded signal as restored information data, and outputting information indicating the absence of an error in the signal; and if there is an error in the output signal of the decoder, discarding the decoded signal and outputting information indicating the presence of an error in the signal.

13. The apparatus of claim 10, wherein the predetermined scheme performs modulo-2 addition on the parity check expressions for each column of the first parity check matrix.

* * * * *